(12) United States Patent
Takahashi (10) Patent No.: US 7,690,095 B2
(45) Date of Patent: Apr. 6, 2010

(54) METHOD FOR MANUFACTURING QUARTZ PIECE

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 159 days.

(21) Appl. No.: 11/823,092

(22) Filed: Jun. 26, 2007

(65) Prior Publication Data
US 2008/0000058 A1 Jan. 3, 2008

(30) Foreign Application Priority Data
Jun. 29, 2006 (JP) ............................. 2006-180475

(51) Int. Cl.
*H04R 17/00* (2006.01)
*H04R 31/00* (2006.01)

(52) U.S. Cl. ............ 29/25.35; 29/25.42; 29/594; 216/13; 216/97; 310/321; 310/370; 331/158

(58) Field of Classification Search ..... 29/25.35–25.42, 29/830, 846; 438/71, 48, 551, 552, 50–51; 333/186, 197, 309; 216/2, 13, 80, 97; 310/319–322, 310/370; 331/158, 174
See application file for complete search history.

(56) References Cited

U.S. PATENT DOCUMENTS

| 5,771,555 | A * | 6/1998 | Eda et al. ................. 29/25.35 |
| 5,998,233 | A * | 12/1999 | Sugitani et al. ............. 438/52 |
| 7,195,715 | B2 * | 3/2007 | Ikeda ..................... 216/40 |
| 7,437,932 | B2 * | 10/2008 | Kawauchi ................ 73/504.12 |
| 7,459,334 | B2 * | 12/2008 | Aratake .................... 438/71 |
| 7,596,851 | B2 * | 10/2009 | Takahashi .................. 29/594 |

FOREIGN PATENT DOCUMENTS

| JP | 8-242134 | 9/1996 |
| JP | 2005-064582 | 3/2005 |

* cited by examiner

*Primary Examiner*—Minh Trinh
(74) *Attorney, Agent, or Firm*—Jordan and Hamburg LLP (57) ABSTRACT

To provide a method for manufacturing a quartz piece which can suppress the deterioration of the CI and the temperature characteristic failure by forming the end surface of the quartz piece perpendicularly. A method for manufacturing a quartz piece that has a shape having two sides facing each other from a quartz substrate, includes the steps of: forming an etching mask provided with an opening area for forming the outside shape along one side out of the two sides which face each other, and provided with no opening area on the other side out of the two sides facing each other, on one surface side of the quartz substrate; and forming an etching mask provided with an opening area for forming an outside shape along the other side out of the two sides which face each other, and provided with no opening area on the one side, on the other surface side of the quartz substrate. Formation of protrusions is reduced when, at the time of etching from one surface side of the quartz substrate, the rate of etching in the direction from the one side toward the other side is greater than the rate of etching in the direction from the other side toward the one side due to the anisotropy of quartz, and at the time of etching from the other surface side of the quartz substrate, the rate of etching in the direction from the other side toward the one side is greater than the rate of etching in the direction from the one side toward the other side due to the anisotropy of quartz.

5 Claims, 11 Drawing Sheets

101 QUARTZ RESONATOR FORMING AREA
20 QUARTZ LAYER
21 QUARTZ PIECE
41, 42 METAL FILM
45, 46 PATTERN

METHOD FOR MANUFACTURING QUARTZ PIECE

BACKGROUND OF THE INVENTION

1. Field of the Invention

The present invention relates to a method for manufacturing a quartz piece, especially relating to a technology to obtain the quartz piece by forming an end surface of the quartz piece perpendicularly to its front and back surfaces so as to reduce the deterioration of the CI and the temperature characteristic failure.

2. Description of the Related Art

A quartz resonator is, for instance, a device which includes a quartz piece (quartz blank) and a pair of electrodes for excitation (excitation electrodes) installed on both front and back surfaces of the quartz piece, and has been widely used in electronic parts such as an oscillator or the like as a reference source for frequencies and time by utilizing the specific character in which once voltage is applied on the excitation electrodes, crystal oscillation is excited by piezoelectric opposite effect of the quartz.

As the manufacturing process of a conventional quartz resonator, a large number of quartz pieces of a prescribed shape such as the shape of a strip of paper (rectangular) are first cut off from a wafer composed of, quartz crystal for instance, and the respective cut-off quartz pieces are etched for the purpose of obtaining desired frequency characteristics so that the thickness thereof is adjusted. After the etching, the quartz piece is cleaned and the excitation electrodes are formed on both surfaces thereof, and a pair of derivation electrodes which are electrically connected to the respective excitation electrodes are formed, for instance, in a way such that they are spread across from the front surface to the back surface of the quartz piece through the end surface. The quartz piece in which the respective electrodes are thus formed and composed as a quartz resonator, is enclosed in a package, for instance, and the derivation electrodes are electrically connected to electrodes arranged in the package, and then it is shipped as a product.

In recent years however, since the miniaturization of a quartz piece has become more advanced, it has become difficult to mold a pallet for carrying out the etching processing in accordance with the size of a quartz piece and the pallet for performing cleaning processes, which makes it difficult to conduct the etching processing and cleaning processing uniformly within the plane of the quartz piece.

Because of the reason described above, it is attempted that a wafer W is formed by etching so that the forming area for the quartz piece has a prescribed thickness, then etching is conducted along the periphery of the quartz piece forming area in a manner that a connecting portion between the quartz piece and the wafer is left, and a groove (through hole) drilled through the front surface to the back surface of the wafer is formed to form the outside shape of the quartz piece. Then, after cleaning it in a state that the quartz piece is fixed on the wafer by the above-described connecting portion, electrodes spread across the front surface to the back surface of the quartz piece as described above are formed utilizing the groove (through hole), and then, the quartz piece is cut off from the wafer.

Figure 9:
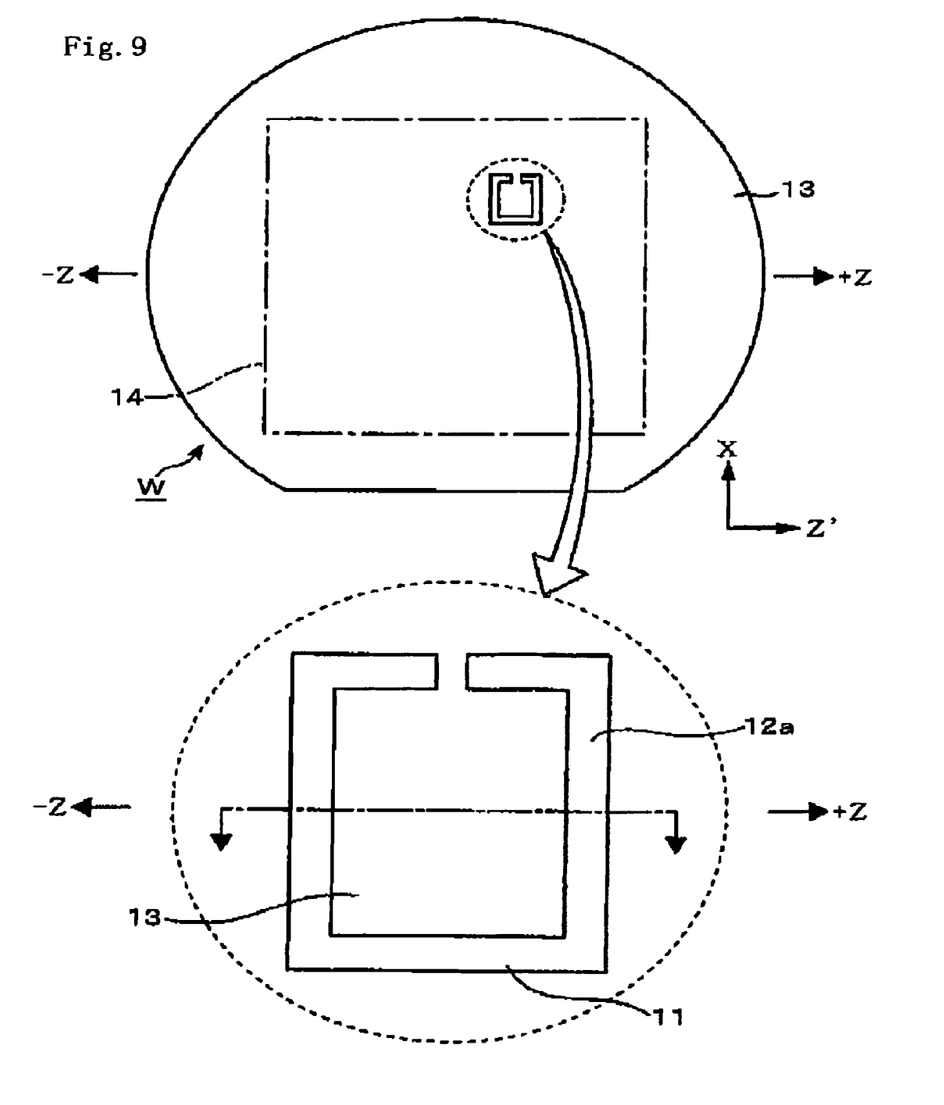
FIG. 9 is an explanatory view showing a pattern formed in the wafer in the manufacturing process of a conventional quartz resonator.
Figure 10A:
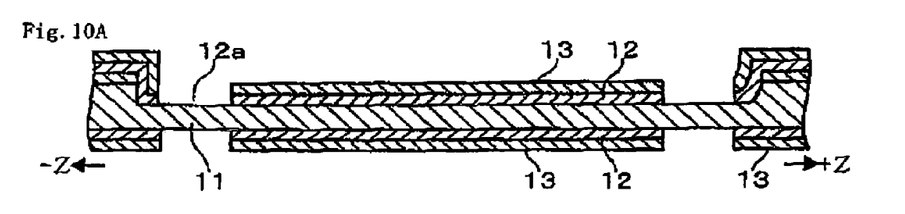
FIGS. 10A, 10B, 10C, 10D are explanatory view showing how etching progresses according to the patterns of the manufacturing process.
Figure 10B:
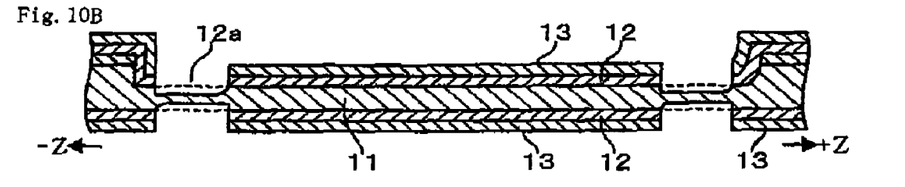
Figure 10C:
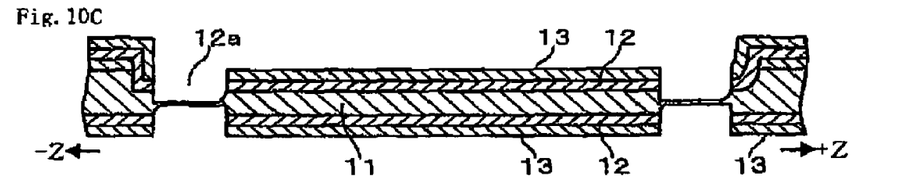
Figure 10D:
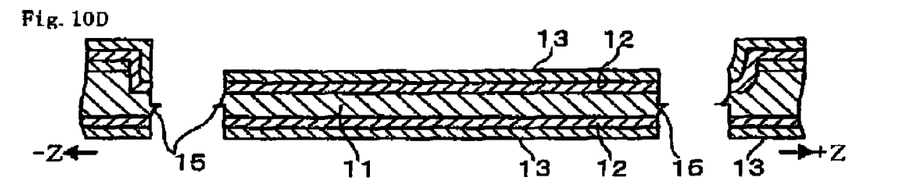

The wafer W at the time of forming the outside shape of the quartz piece as described above will be explained using FIG. 9. The wafer W is composed of an AT cut quartz, and metal films 12 which serve as a mask for etching a quartz layer 11 are deposited on both front and back surfaces of the quartz layer 11. A mask pattern 12a in a square-frame shape is opened along the quartz piece forming area to form, for instance, the outside shape of the rectangular quartz piece in each metal film 12 so that the quartz layer 11 is exposed. Note that a resist film 13 which is deposited for forming the mask pattern 12a is arranged on the upper portions of the respective metal films 12. Although only one of the mask patterns 12a is shown in the drawing, a large number of the mask patterns 12a are actually formed, for instance, at intervals over the whole device forming area 14 which is the area surrounded by a chain line. The arrow Z' in the drawing indicates the axis slanting at a prescribed angle from the Z axis which is a crystal axis of the quartz, the arrow X indicates the X axis which is a crystal axis respectively, and the mask pattern 12a is formed along these axes.

As the quartz that composes the wafer W, the previously described AT cut quartz is mainly used because it has a merit of obtaining favorable frequency stability or the like when the quartz resonator is used at around a room temperature. The AT cut quartz has, however, anisotropy which is responsible for the cause of the following problem during etching to form the outside shape of the quartz piece.

FIG. 10 shows how the wafer W which is an AT cut quartz substrate is immersed in a solution containing such as hydrofluoric acid, and the vertical cross sectional face shown by the arrow in a chain line in FIG. 10 is etched along the pattern 12a. As for the Z' axis, if the right side of the wafer W seen from the front side in the drawing is called +Z direction, and the left side is called −Z direction, the rate of etching in the −Z direction is greater compared with the rate of etching in the +Z direction in the etching which advances from the front side of the wafer W toward the back side as shown in FIG. 10A to FIG. 10C. Accordingly, the wafer W is etched obliquely from the +Z direction to the −Z direction. In the etching which advances from the back surface side of the wafer W toward the front side, the rate of etching in the +Z direction is greater than the rate of etching in the −Z direction, so that the wafer W is etched obliquely from the −Z direction to the +Z direction. As a result, after the etching is completed, protrusions 15 are left on the end surface along the X direction of the quartz piece as shown in FIG. 10D.

Figure 11A:
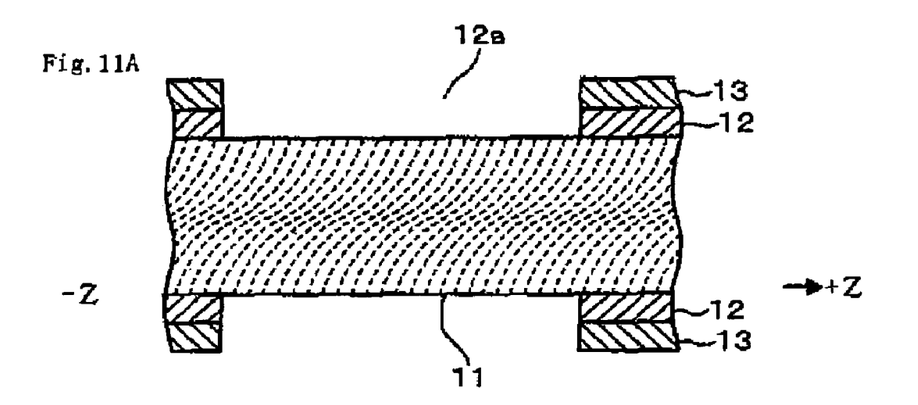
FIGS. 11A, 11B, 11C are explanatory view showing the appearance of a quartz layer in the mask pattern during etching.
Figure 11B:
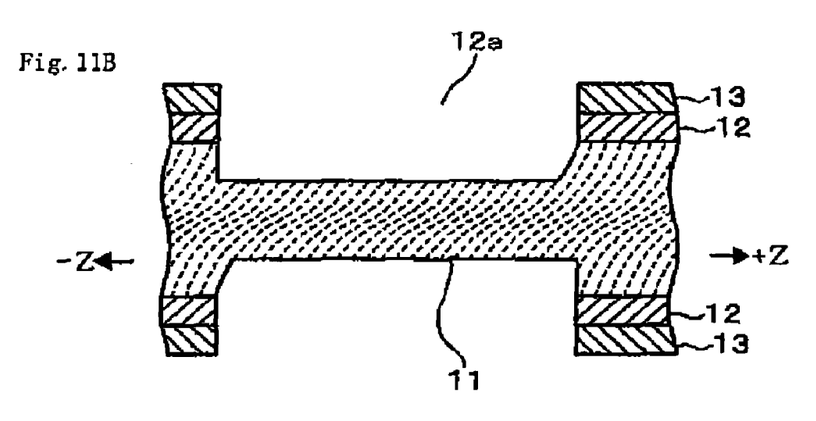
Figure 11C:
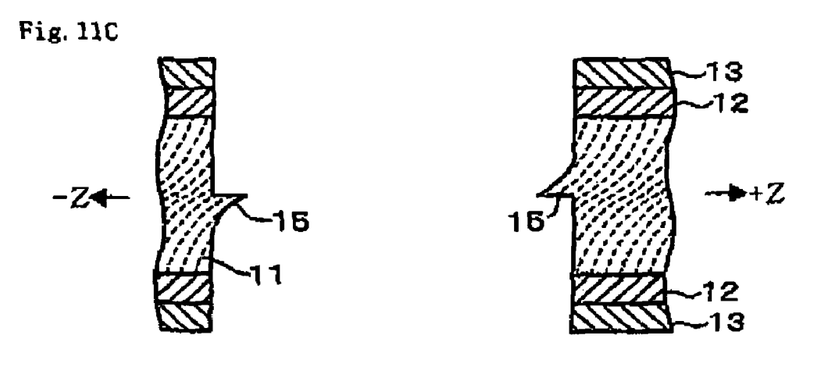

FIGS. 11A to 11C show an enlarged quartz layer 11 in the mask pattern 12a during etching. The reason why the etching advances in a manner as described above is because the direction of crystal arrangement in the quartz layer 11 advances obliquely as shown in these drawings, and the etching progresses along the direction of the crystal arrangement.

It is preferable for the end surface of a small quartz piece having a high frequency to be formed perpendicularly to the front and back surfaces thereof, and if the protrusions 15 are formed on the end surface as described above, it might cause the deterioration of the CI (crystal impedance) and the temperature characteristic failure of the quartz piece. In addition, when the above-described derivation electrode is formed by forming a metal film is formed on the quartz piece 13 by means of, for instance, sputtering after forming the outside shape of the quartz piece by conducting etching as described above, since the surface area of the end surface of the quartz piece becomes larger than an expected area due to the protrusions 15, the thickness of the metal film formed on the end surface is smaller than an expected thickness, which makes the electric resistance of the metal film higher than expected. As a result, the CI value (equivalent resistance value) of the quartz resonator might be high (deteriorate) and the oscillation loss could be large.

In Patent Documents 1 and 2, the technology of conducting etching to get a smooth quartz surface while reducing the effect of the quartz anisotropy is described, but the end surface of a quartz piece is paid no attention as described above, and the inventions described in the above documents cannot solve the above-described problems.

[Patent Document 1]
Japanese Patent Application Laid-open No. Hei 8-242134 (column 0017, column 0020)

[Patent Document 2]
Japanese Patent Application Laid-open No. 2005-64582 (column 0033, column 0034)

SUMMARY OF THE INVENTION

The problems of the present invention is to provide a method for manufacturing a quartz piece, which forms the end surface of the quarts piece perpendicularly to the front and back surfaces of the quartz piece so that the deterioration of CI and temperature characteristic failure can be restrained, when a quartz substrate having anisotropy is etched for forming the outside shape of the quartz piece having two sides facing each other.

A method for manufacturing a quartz piece that has a shape which has two sides facing each other from a quartz substrate, comprising the steps of:

forming an etching mask provided with an opening area for forming the outside shape along one side out of the two sides which face each other, and provided with no opening area on the other side out of the two sides facing each other, on one surface side of the quartz substrate;

forming an etching mask provided with an opening area for forming the outside shape along the other side out of the two sides which face each other, and provided with no opening area on the one side, on the other surface side of the quartz substrate;

forming the outside shape of the quartz piece by immersing the quartz substrate into an etching solution so as to form the one side of the quartz piece by etching from the one surface side of the quartz substrate and to form the other side of the quartz piece by etching from the other surface side of the quartz substrate; and removing the etching masks from the quartz substrate,
wherein when etching from the one surface side of said quartz substrate, the rate of etching from the one side to the other is greater than the rate of etching from the other side to the one side due to the anisotropy of quartz, and wherein when etching from the other surface side of the quartz substrate, the rate of etching from the other side to the one side is greater than the rate of etching from the one side to the other due to the anisotropy of quartz.

The method for manufacturing the quartz piece further includes, for instance, the step of: separating the quartz piece from the quartz substrate by cutting a portion of the quartz substrate after removing the etching masks, and the quartz substrate is, for instance, an AT cut substrate, in which the two sides facing each other in the quartz piece are parallel to the X axis of the crystal.

The above-described quartz piece is, for instance, rectangular; and the opening area for forming the outside shape formed on the one surface side of the quartz substrate is formed extending from one side out of the two sides facing each other to the side adjacent to the one side, and the opening area for forming the outside shape formed on the other side of the above-described quartz substrate is formed extending from the other side out of the two sides facing each other to the side adjacent to the other side.

According to the method for manufacturing the quartz piece of the present invention, the end surface of the quartz piece is formed so as to have a high degree of perpendicularity with respect to the front surface and the back surface thereof, so that formation of a protrusion is suppressed on the end surface. As a result, the deterioration of the CI and the temperature characteristic failure of this quartz piece and those of the quartz resonator manufactured using this quartz piece can be reduced.

DETAILED DESCRIPTION OF TIE PREFERRED EMBODIMENT(S)

Figure 1A:
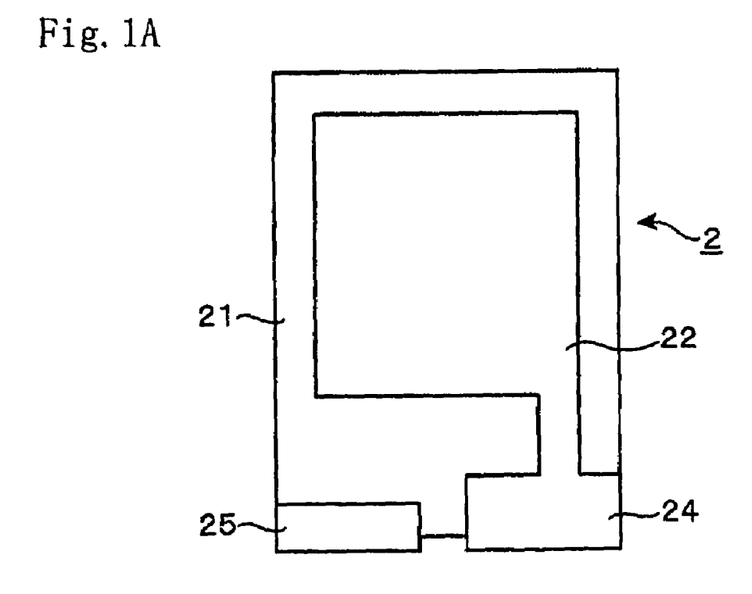
FIGS. 1A, 1B are block diagram of a quartz resonator manufactured according to the manufacturing process in an embodiment of the present invention.
Figure 1B:
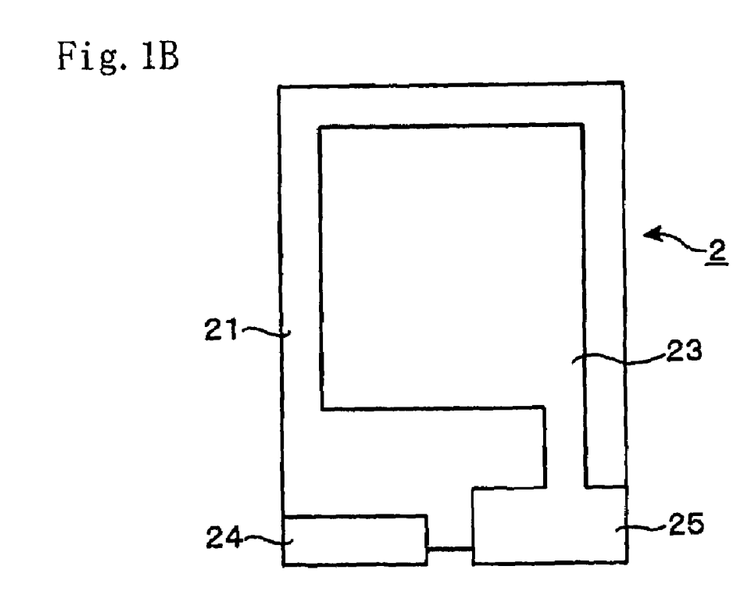

Next an embodiment of the present invention will be shown. In this embodiment, the process for manufacturing a quartz resonator 2 shown in FIG. 1 from the wafer W which is an AT cut quartz substrate is explained. FIGS. 1A and 1B show the front surface and the back surface of the quartz resonator 2 respectively, and the front and back surfaces of the quartz resonator are composed so that they have a similar layout to each other. 21 in the drawing is a quartz piece formed in rectangular (the shape of a strip of paper), and 22 and 23 in the drawing are a pair of excitation electrodes respectively installed in the centers of the front and back surfaces of the quartz resonator 2. 24 and 25 in the drawing are derivation electrodes, and integrally formed with the excitation electrodes 22 and 23 respectively on the front and back surfaces of the quartz piece 21. The derivation electrode 24 (25) is formed in a manner that it is extended from the excitation electrode 22 (23) toward the outside of the quartz piece 21 respectively, and is spread across the back surface (front surface) via the end face of the quartz piece 21.

Figure 2:
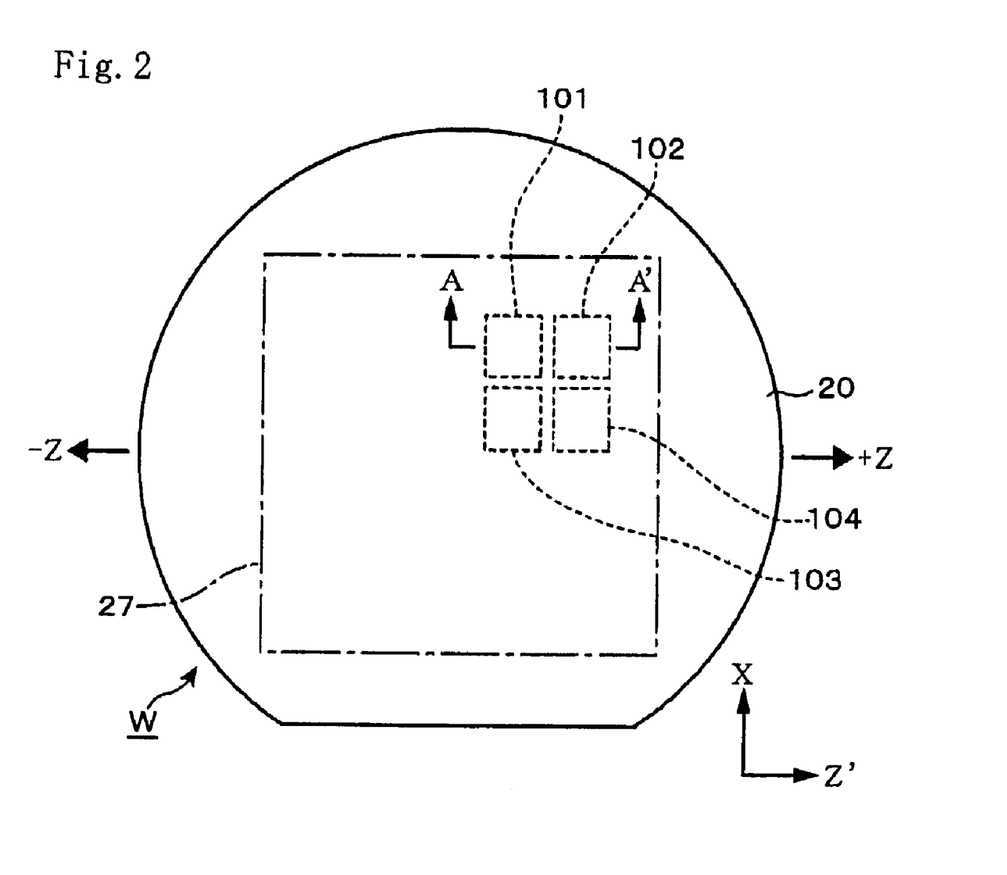
FIG. 2 is a block diagram of a wafer used for the above-described manufacturing process.

FIG. 2 shows the front surface of the wafer W. The area surrounded by dotted lines in the drawing shows areas 101 to 104 where the quartz resonators 2 are formed, and each area is defined as a square area which is surrounded by a segment of a line parallel to the X axis which is a crystal axis of the wafer W, and by a segment of a line parallel to the Z' axis which is slanting at a prescribed angle from the Z axis being a crystal axis of the wafer W. In an explanation in drawings for this FIG. 2 or later, the Z' axis on the right side seen from the wafer W front side is to be called +Z direction, and the left side thereof is to be called −Z direction, similarly to the explanation of the conventional art. The quartz resonator is actually not confined to the four areas 101 to 104, the areas where the resonator 2 is formed are defined all over the whole device forming area 27 surrounded by the chain line in the drawing-leaving a space between each. Each processing which will be described later is conducted to the whole device forming area 27.

Figure 3A:
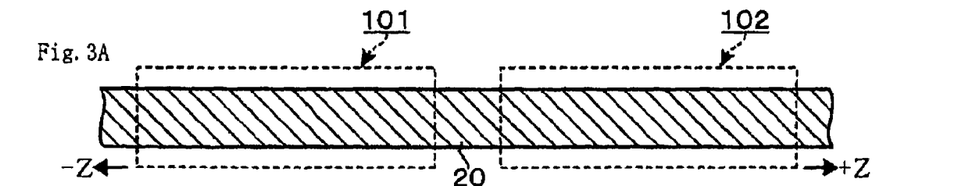
FIGS. 3A, 3B, 3C, 3D, 3E, 3F are an explanatory view of the manufacturing process of the above-described quartz resonator.
Figure 3B:
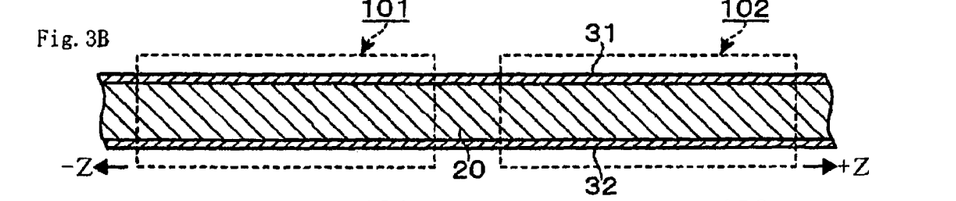
Figure 3C:
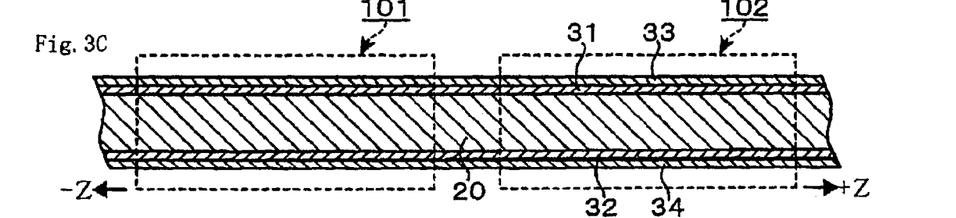

The processes of forming the quartz resonator 2 from the wafer W will be explained one by one using FIG. 3 to FIG. 5 next. FIG. 3 shows how the vertical cross section of the quartz resonator forming areas 101 and 102 shown by the arrows A-A' in FIG. 2 changes by performing each processing to the wafer W. As shown in FIGS. 3A and 3B, metal films 31 and 32 made of chromium (Cr) and gold (Au) are first deposited respectively on the front and back surfaces of a quartz layer 20 of the wafer W, and then, as shown in FIG. 3C, resist films 33 and 34 are deposited respectively on the metal films 31 and 32.

Figure 3D:
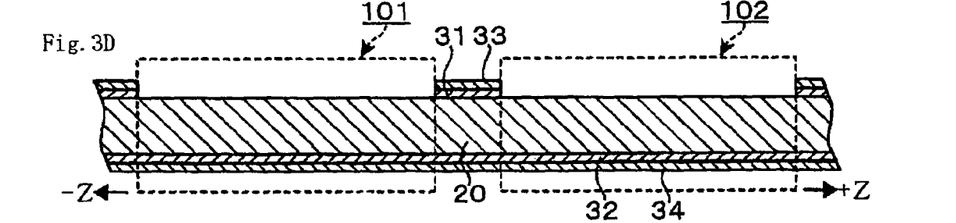
Figure 3E:
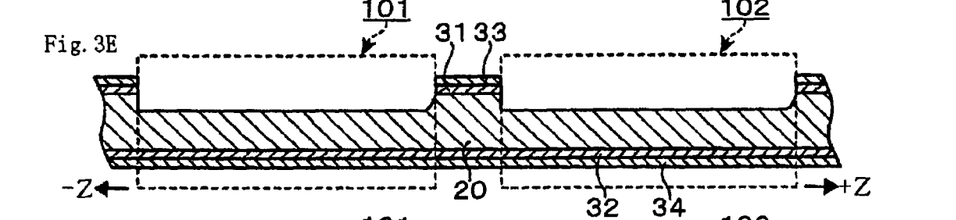
Figure 3F:
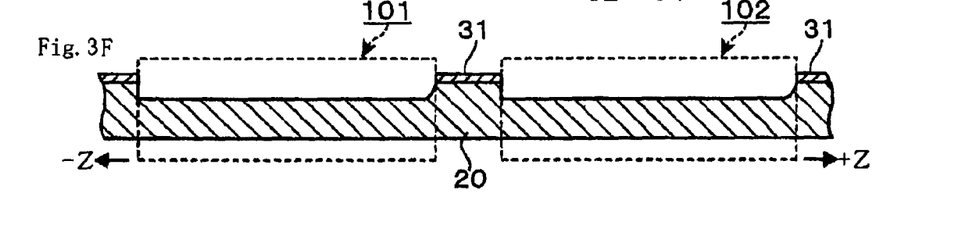

The wafer W is developed after exposure using pattern masks corresponding to the shapes of the areas 101 to 104, and the resist films 33 on the forming areas 101 to 104 of the respective quartz resonators 2 are removed. Next, the metal films 31 in the respective areas 101 to 104 are etched using the resist films 33 left without being removed as a mask and removed (FIG. 3D). Thereafter, the quartz layer 20 in the areas 101 to 104 is etched using the metal film 31 as a mask and the thickness of the quartz layer 20 is adjusted so that the quartz piece 21 formed from the quartz layer 20 can obtain a desired frequency characteristic (FIG. 3E). After the etching, for instance, the resist film 33 on the front surface side of the wafer W, the metal film 32 on the back surface side, the resist film 34 on the back surface side are peeled off, and confirmation of the frequency characteristic of the quartz layer 20 is conducted using a probe (not shown) (FIG. 3F).

Figure 4A:
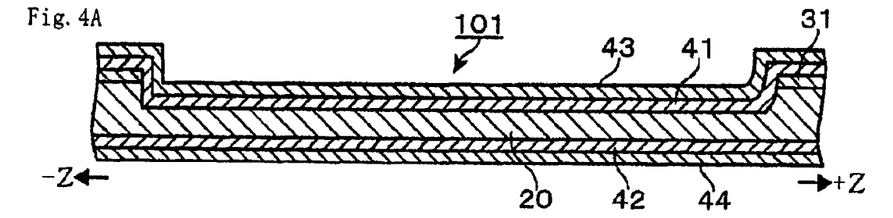
FIGS. 4A, 4B, 4C, 4D, 4E are an explanatory view of the manufacturing process of the above-described quartz resonator.

The subsequent process after the above will be explained with reference to a drawing on the quartz resonator forming area 101. As shown in FIG. 4A, metal films 41 and 42 made of chromium or gold, which will be etching masks for forming the outside shape of the quartz piece 21, are deposited respectively on the front and back surfaces of the wafer W after the confirmation described above by sputtering or the like, then resist films 43 and 44 are deposited on these metal films 41 and 42, respectively. Thereafter, these resist films 43 and 44 are exposed and developed so that prescribed resist patterns are formed on the respective resist films 43 and 44, the metal films 41 and 42 are etched along these resist patterns so that mask patterns 45 and 46 which serve as an opening area for forming the outside shape are formed respectively so that the quartz layer 20 is exposed on the metal films 41 and 42 (FIG. 4B).

Figure 6A:
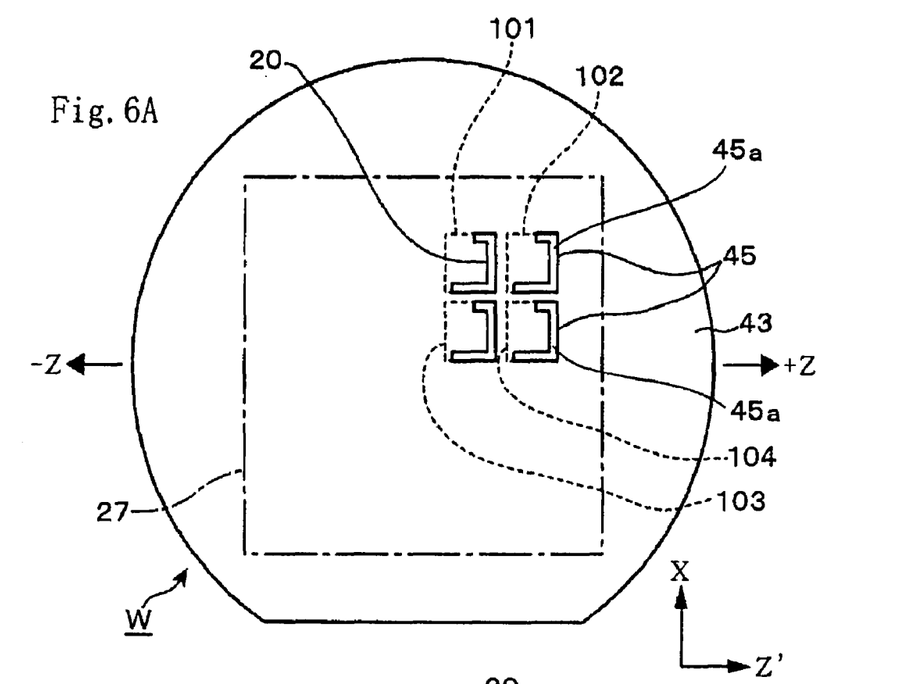
FIGS. 6A, 6B, are explanatory view showing the state patterns formed on the front and back surfaces of the wafer in the above-described manufacturing process.
Figure 6B:
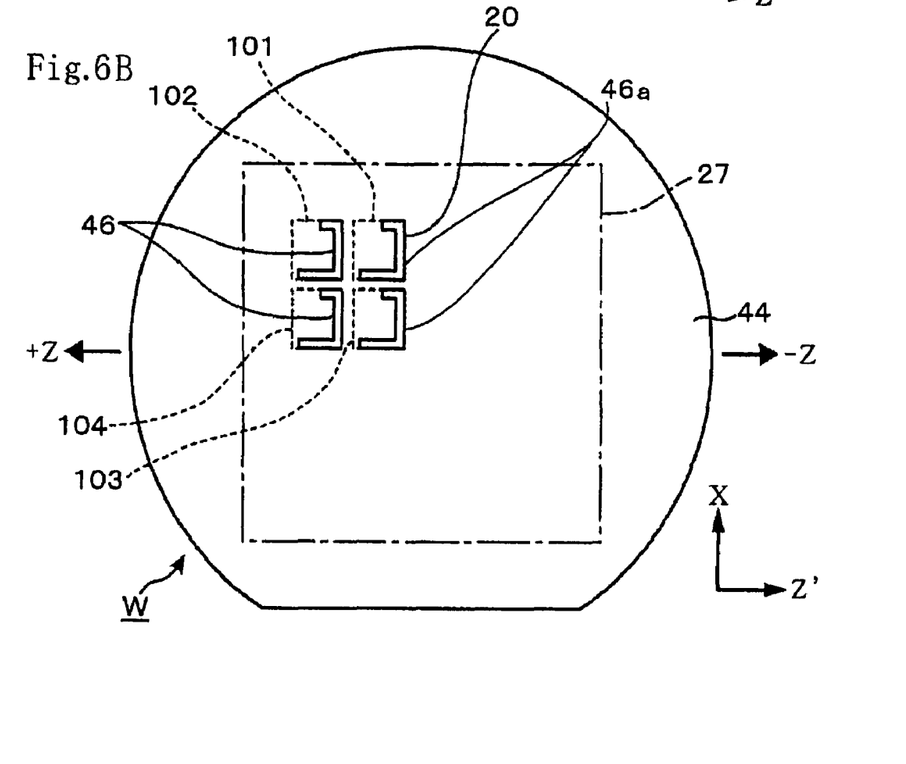

FIGS. 6A and 6B respectively show the front surface side (one surface side) and the back surface side (the other surface side) of the wafer W on which the mask patterns 45 and 46 are formed as described above. As shown in the drawings, in the quartz resonator forming areas 101 to 104, the mask pattern 45 on the front surface of the wafer W is formed along the periphery of the quartz piece 21 to be formed extending from the side along the X axis of the edge portion in each area to the adjacent side along the Z' axis thereof, and a side 45a along the X axis of the mask pattern 45 is formed in the +Z direction in which etching goes slowly when the wafer W is etched from the front surface side. In the quartz resonator forming areas 101 to 104, the mask pattern 46 on the back surface of the wafer W is formed along the periphery of the quartz piece 21 to be formed extending from the side along the X axis of the edge portion in each area to the adjacent side along the Z' axis thereof, and a side 46a along the X axis of the mask pattern 46 is formed in the −Z direction in which etching goes slowly when the wafer W is etched from the back surface side. The respective sides 45a and 46a of the patterns 45 and 46 are formed along the sides facing each other of the quartz 21.

Figure 7:
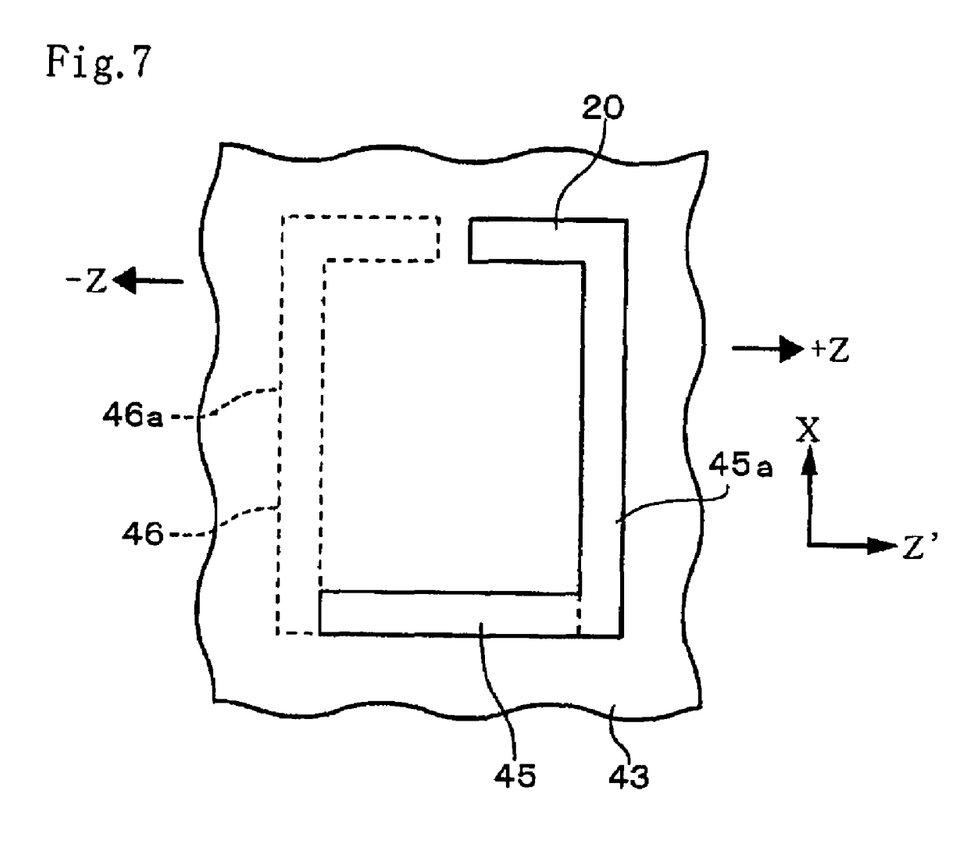
FIG. 7 is an explanatory view showing positional relation of the above-described pattern.

FIG. 7 shows positional relation between the mask patterns 45 and 46 respectively. As clearly understood from this drawing, they are formed so that the respective reverse L portions are not overlapped each other. This is because after conducting etching along the patterns 45 and 46 so as to form the outside shape of the quartz piece 21 as to be described later, a connecting portion to connect the quartz piece 21 and the wafer W is maintained, which makes it possible to keep the quartz piece 21 without being separated from the wafer W to fix the position.

Figure 4B:
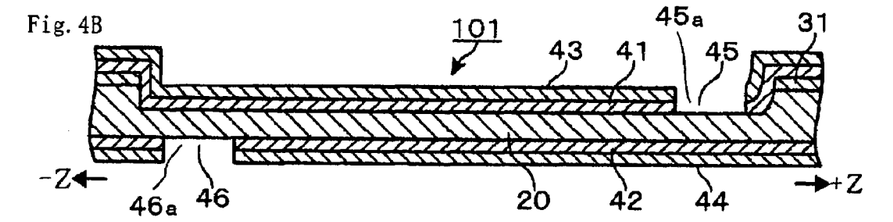
Figure 4C:
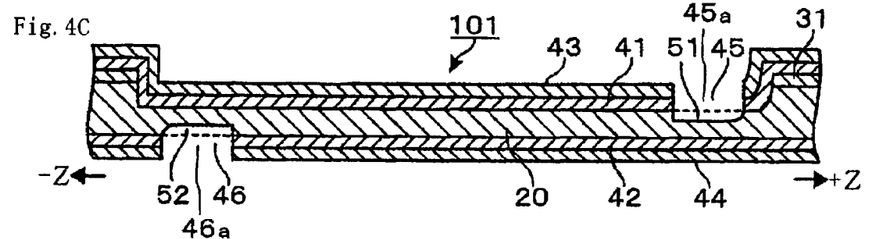
Figure 4D:
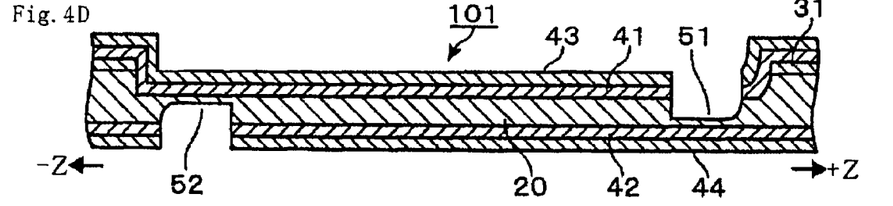

Back to FIG. 4B, after the mask patterns 45 and 46 are formed as described above, for instance the wafer W is immersed in a solution containing hydrofluoric acid which serves as an etching solution, the quartz layer 20 is etched along the mask patterns 45 and 46 from the front surface side and the back surface side, and grooves 51 and 52 are formed respectively. As shown in FIGS. 4C and 4D, the etching rate in the direction advancing from +Z direction side to −Z direction side is greater than the etching rate in the direction advancing from −Z direction side to +Z direction in the groove 51 due to the anisotropy of quartz.

In the groove 52, the etching rate in the direction advancing from −Z direction side to +Z direction side is greater than the etching rate in the direction advancing from +Z direction side to −Z direction due to the anisotropy of quartz. Due to the advance of the etching in this manner, the side walls on the side advancing toward inside of the area 101 of the grooves 51 and 52, in other words, the areas to be the end surfaces of the quartz piece 21 are formed so that they have a high degree of perpendicularity.

Figure 4E:
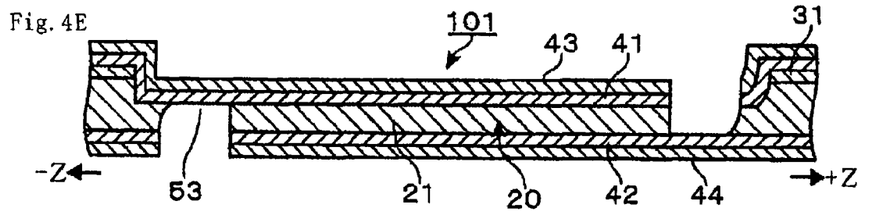

During advancing of the etching, when the grooves 51 and 52 are connected with each other to become one groove 53, so that the metal films 41 and 42 are exposed via the groove 53 and the outside shape of the quartz piece 21 is formed, the etching is finished (FIG. 4E).

Figure 5A:
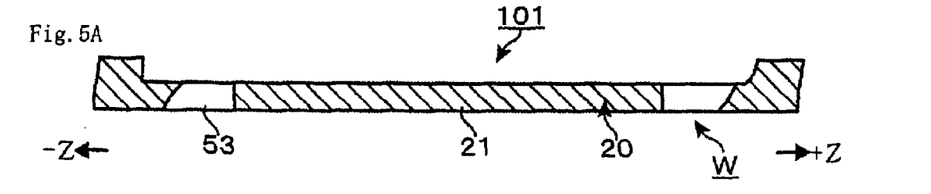
FIGS. 5A, 5B, 5C, 5D, 5E are explanatory view of the manufacturing process of the above-described quartz resonator.
Figure 5B:
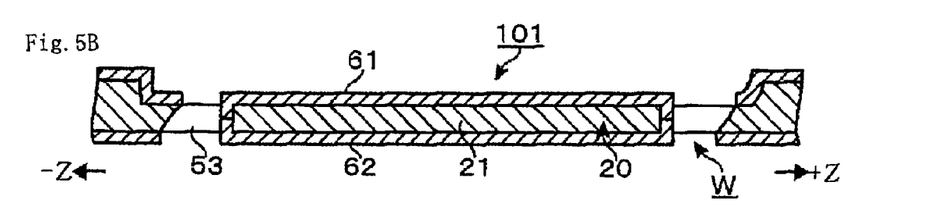
Figure 5C:
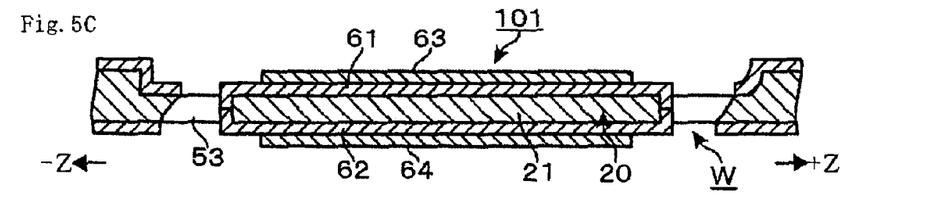
Figure 5D:
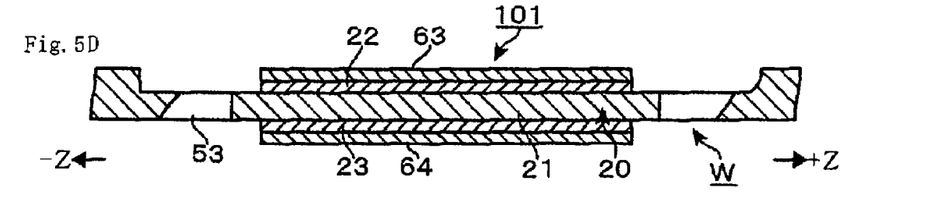
Figure 5E:
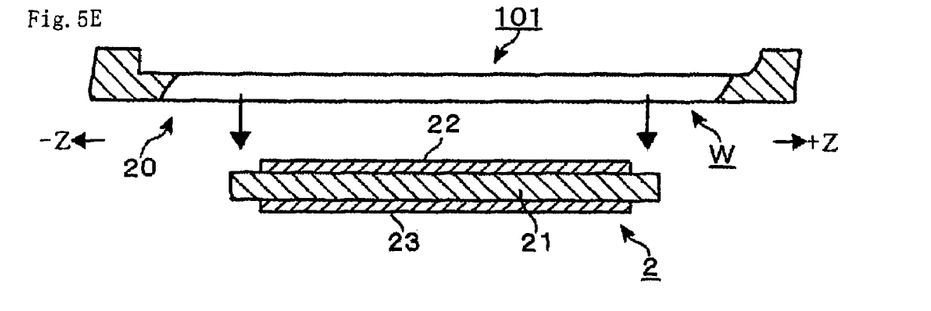

Each process after the outside shape of the quartz piece 21 after formation of the outside shape of the quartz piece 21 will be explained with reference to FIG. 5. In FIG. 5, the line for the opening of the groove 53 which was omitted in FIG. 4 for convenience in that drawing is shown without omission. As shown in FIG. 5A at first, the resist films 43, 44 and the metal films 31, 41 and 46 are removed from the front and the back surfaces of the quartz layer 20, and then, the front and the back surfaces of the wafer W are cleaned to form electrodes on the respective quartz pieces 21. After the cleaning process, metal films 61 and 62 to form the excitation electrodes 22, 23 and the derivation electrodes 24, 25 shown in FIG. 1 are respectively formed on the front and the back surfaces of the quartz layer 20 by sputtering, for instance (FIG. 5B). The metal films 61 and 62 are formed so as to spread across the end surface of the quartz piece 21 via the groove 53. Then, resist films 63 and 64 are respectively formed on the respective metal films 61 and 62, so as to respectively correspond to the shapes of the excitation electrodes 22, 23 and the derivation electrodes 24, 25 of the quartz piece 21 by being exposed and developed (FIG. 5C). The metal films 61 and 62 are etched using these newly formed resist films 63 and 64 as a mask so as to form the excitation electrodes 22, 23 and the derivation electrodes 24, 25 (FIG. 5D), and the resist films 63 and 64 are removed after formation of the respective electrodes.

Figure 8A:
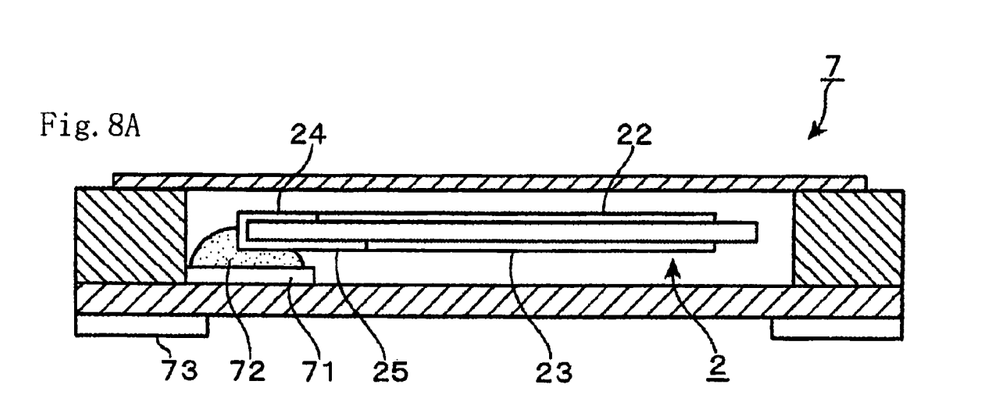
FIG. 8A, 8B are explanatory view showing the quartz resonator in a state shielded in a package.
Figure 8B:
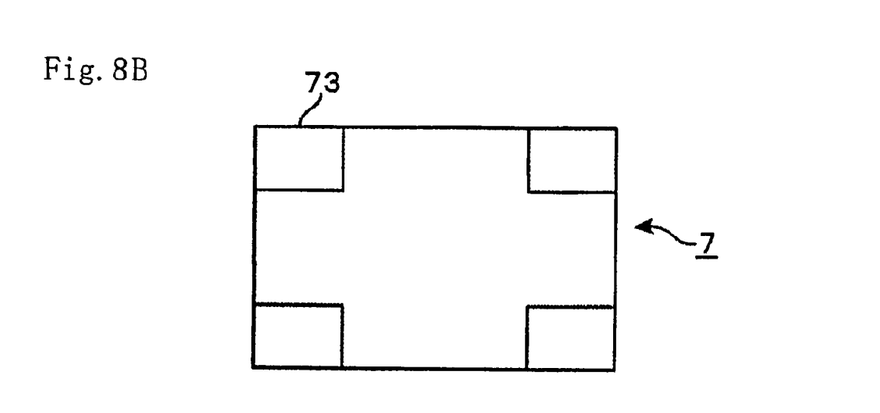

After the removal of the resist films 63 and 64, a connecting portion connecting between the wafer W and the quartz piece 21 is cut by laser dicing for instance, and the quartz resonator 2 is formed by cutting off the quartz piece 21 from the wafer 21. The quartz resonator 2 is shipped, for instance, by being enclosed in a package 7 as shown in FIGS. 8A and 8B. In the drawing, 71 is a pair of electrodes arranged in the package 7, which is electrically connected to the derivation electrodes 24 and 25 via a conductive adhesive 72. 73 in the drawing is an electrode arranged under the package 7 and electrically connected to the electrode 71 via wiring in the package 7.

In the present embodiment, the metal films 41 and 42 which will be an etching mask are formed on the front and the back surfaces of the wafer which is an AT cut quartz substrate having anisotropy, the mask pattern 45 which has an opening in a shape of the letter U is formed on the metal film 41 on the front surface of the wafer W so as to surround the +Z direction side of the quartz resonator forming area so as to expose the quartz layer 20, and the mask pattern 46 which has an opening in a shape of the letter U is formed on the metal film 42 on the back surface of the wafer W so as to surround the -Z direction side of the quartz resonator forming area so as to expose the quartz layer 20. Then, etching is conducted along the respective patterns 45 and 46. By conducting the etching in this manner, in the quartz layer 20 exposed via the mask pattern 45, the etching rate in the direction from +Z direction side toward -Z direction side is larger compared with the etching rate in the direction from -Z direction side toward +Z direction side, and in the quartz layer 20 exposed via the mask pattern 46, the etching rate in the direction from -Z direction side toward +Z direction side is larger compared with the etching rate in the direction from +Z direction side toward -Z direction side. As a result, the end surface of the quartz piece 21 is formed so as to have a high degree of perpendicularity with respect to the front and the back surfaces of the quartz piece 21, and formation of protrusions on the end surface is suppressed. Accordingly, in the quartz piece 21 and the quartz resonator 2 including the quartz piece 21, the deterioration of the CI and the temperature characteristic failure are restrained.

Since the respective quartz pieces 21 are cut off from the wafer W after forming the electrodes 22 to 25 on the quartz pieces 21 in the present embodiment, it is possible to prevent the respective processing such as etching or cleaning which are conducted for adjusting the thickness of the respective quartz pieces 21 until the cutting off from fluctuation within the planes of the respective quartz pieces 21. In addition, since the respective processings conducted until the cutting off can be done collectively for every wafer W, the throughput can be enhanced.

It should be noted that though the derivation electrodes 24 and 25 are formed so as to cover the end surface of the quartz piece 21 formed along the Z' axis in the present embodiment, since formation of protrusion on the end surface of the quartz piece 21 along the X axis is suppressed as described above, it is possible to form the derivation electrodes so as to cover the end surface. Accordingly, the freedom in layout of electrodes becomes great.

Furthermore, it is acceptable that instead of forming the letter U shaped patterns 45 and 46, for instance, on the front and the back surfaces of the wafer W, for instance, an arc-shaped pattern jutting out in the direction along +Z direction is formed on the front surface thereof, and an arc-shaped pattern jutting out in the direction along -Z direction is formed on the back surface, and then, by conducting etching along these patterns, the quartz piece is formed so that the outside surface thereof is circular.

What is claimed is:

1. A method for manufacturing a quartz piece out of a quartz substrate, the quartz piece having a perimeter shape having first and second side edge perimeter surfaces opposing each other, wherein the quartz substrate has first and second main surfaces opposing each other, the method comprising the steps of:
    forming a first etching mask on said first main surface, the first etching mask being provided with a first opening area for etching said first main surface so as to form said first side edge perimeter surface extending inward from said first main surface for forming a portion of the perimeter shape defined by said first side edge perimeter surface, and said first etching mask being provided with no opening area corresponding to the second side edge perimeter surface;
    forming a second etching mask on said second main surface, the second etching mask being provided with a second opening area for etching said second main surface so as to form said second side edge perimeter surface extending inward from said second main surface for forming a portion of the perimeter shape defined by said second side edge perimeter surface, and said second etching mask being provided with no opening area corresponding to the first side edge perimeter surface;
    forming the perimeter shape of the quartz piece by immersing said quartz substrate into an etching solution so as to form said first side edge perimeter surface of the quartz piece by etching from the first main surface of said quartz substrate and to form said second side edge perimeter surface by etching from the second main surface of said quartz substrate; and
    removing said first and second etching masks from said quartz substrate, wherein when etching from the first main surface of said quartz substrate, the rate of etching at first side of the first opening is greater than the rate of etching from a second side of the first opening due to the anisotropy of quartz, and wherein when etching from the second main surface of the quartz substrate, the rate of etching at a first side of the second opening is greater than the rate of etching at a second side of said second opening due to the anisotropy of quartz.

2. The method for manufacturing the quartz piece according to claim 1, further comprising the step of:
    separating the quartz piece from the quartz substrate by cutting off a portion of said quartz substrate after removing said first and second etching masks.

3. The method for manufacturing the quartz piece according to claim 1, wherein:
    said quartz substrate is an AT cut substrate; and
    the first and second side edge perimeter surfaces of said quartz piece are parallel to the X axis of the crystal.

4. The method for manufacturing the quartz piece according to claim 1, wherein said quartz piece is rectangular.

5. The method for manufacturing the quartz piece according to claim 1, wherein the first opening area is further configured to permit etching of a third side edge perimeter surface of the quartz piece which is disposed adjacent said first side edge perimeter surface, and the second opening area is further configured to permit etching of a fourth side edge perimeter surface of the quartz piece which is disposed adjacent said second side edge perimeter surface.

* * * * *